United States Patent
Mangano et al.

(10) Patent No.: US 10,236,066 B2
(45) Date of Patent: Mar. 19, 2019

(54) METHOD OF MANAGING SEMICONDUCTOR MEMORIES, CORRESPONDING INTERFACE, MEMORY AND DEVICE

(71) Applicant: STMicroelectronics S.r.l., Agrate Brianza (IT)

(72) Inventors: Daniele Mangano, San Gregorio di Catania (IT); Michele Alessandro Carrano, Catania (IT); Gaetano Di Stefano, San Pietro Clarenza (IT); Roberto Sebastiano Ruggirello, Trapani (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/692,158

(22) Filed: Aug. 31, 2017

(65) Prior Publication Data
US 2018/0240523 A1    Aug. 23, 2018

(30) Foreign Application Priority Data
Feb. 22, 2017    (IT) .......................... 102017000020134

(51) Int. Cl.
| | | |
|---|---|---|
| G11C 16/10 | (2006.01) | |
| G11C 8/20 | (2006.01) | |
| G11C 13/00 | (2006.01) | |
| G06F 12/02 | (2006.01) | |
| G06F 12/0868 | (2016.01) | |

(52) U.S. Cl.
CPC .......... *G11C 16/10* (2013.01); *G06F 12/0246* (2013.01); *G06F 12/0868* (2013.01); *G11C 8/20* (2013.01); *G11C 13/004* (2013.01); *G11C 13/0069* (2013.01); *G06F 2212/214* (2013.01); *G06F 2212/461* (2013.01); *G06F 2212/7201* (2013.01); *G06F 2212/7207* (2013.01); *G06F 2212/7209* (2013.01)

(58) Field of Classification Search
CPC .......... G11C 16/10; G11C 16/06; G11C 8/20; G11C 13/004; G11C 13/0069; G06F 12/0246; G06F 12/0868; G06F 2212/214; G06F 2212/461; G06F 2212/7201; G06F 2212/7207; G06F 2212/7209
USPC ............. 365/185.11, 185.28, 185.29, 185.33
See application file for complete search history.

(56) References Cited

U.S. PATENT DOCUMENTS

| | | | | |
|---|---|---|---|---|
| 4,473,878 A * | 9/1984 | Zolnowsky | ......... | G06F 12/1036 711/200 |
| 8,407,410 B2 * | 3/2013 | Abali | .................. | G06F 12/0246 711/103 |
| 9,092,152 B1 * | 7/2015 | Piszczek | ................ | G06F 3/0647 |
| 2004/0054850 A1 * | 3/2004 | Fisk | ...................... | H04L 41/147 711/112 |
| 2008/0270680 A1 | 10/2008 | Chang | | |

(Continued)

*Primary Examiner* — Tan T. Nguyen
(74) *Attorney, Agent, or Firm* — Slater Matsil, LLP (57) ABSTRACT

A non-volatile data memory space for a range of user addresses is provided by means of a range of non-volatile flash memory locations for writing data. The range of flash memory locations for writing data is larger (e.g., 4 KB v. 100 B) than the range of user addresses. Data for a same user address may thus be written in different flash memory locations in a range of flash memory locations with data storage endurance correspondingly improved.

22 Claims, 6 Drawing Sheets

(56) References Cited

U.S. PATENT DOCUMENTS

| | | | |
|---|---|---|---|
| 2010/0023672 A1* | 1/2010 | Gorobets | G06F 12/0246 |
| | | | 711/103 |
| 2010/0110748 A1* | 5/2010 | Best | G06F 12/0638 |
| | | | 365/51 |
| 2011/0197017 A1* | 8/2011 | Yu | G06F 12/0246 |
| | | | 711/103 |
| 2012/0011299 A1* | 1/2012 | Mylly | G06F 12/0246 |
| | | | 711/103 |
| 2014/0181374 A1 | 6/2014 | Ellard | |
| 2014/0281140 A1 | 9/2014 | Mehrotra et al. | |
| 2015/0234740 A1* | 8/2015 | Aochi | G06F 12/0246 |
| | | | 711/103 |
| 2017/0262365 A1* | 9/2017 | Kanno | G06F 12/06 |

\* cited by examiner

METHOD OF MANAGING SEMICONDUCTOR MEMORIES, CORRESPONDING INTERFACE, MEMORY AND DEVICE

CROSS-REFERENCE TO RELATED APPLICATIONS

This application claims priority to Italian Application No. 102017000020134, filed on Feb. 22, 2017, which application is hereby incorporated herein by reference.

TECHNICAL FIELD

The description relates to semiconductor memories.

BACKGROUND

Various types of general-purpose microcontroller unit (MCU) applications may involve storing data in a Non Volatile Memory (NVM).

Most MCUs may embed some kind of NVM memories, with the specific type of NVM embedded in the device depending, for instance, on the particular silicon technology used.

For instance, various modern technologies may implement NVMs with flash memories, and the corresponding category of MCUs represents a significant quota of MCUs currently available on the market. Efficiently supporting data storing in NVMs for MCUs embedding flash memories may therefore represent a valuable asset.

When used, e.g., for data, a NVM is expected to exhibit good "endurance" characteristics, e.g., in excess of 100 Kcycles, this meaning that an acceptable figure for the endurance of the non-volatile memory used to store data is too thousand write cycles with a same memory address expected to be written at least 100K times without the risk of failure, i.e. facilitating data integrity.

Flash memories as used, e.g., to store code may exhibit an endurance of 10/20 Kcycles, which is far from the 100,000 cycle figure discussed above.

An option to address this problem may involve embedding in a device a dedicated NVM memory to handle data. While notionally solving the problem, the production cost of such a device would be significantly affected (primarily in terms of silicon cost), thus leading to products hardly competitive on the market.

Another approach may involve handling data write by software, with the user taking care of performing writes at proper physical memory addresses so that a same location is not written too extensively in order to avoid the risk of NVM failure. Such an approach may involve the use of various features such as memory data pointers, erase, data retrieving, and so on, adding complexity on the user side, again making that solution hardly attractive on the market.

SUMMARY

One or more embodiments may be applied, e.g., in Non Volatile Memories.

The points discussed above indicate the desirability a hardware support capable of handling data in flash memories efficiently and at a reduced cost.

One or more embodiments facilitate providing such a support by overcoming the drawbacks outlined in the foregoing.

One or more embodiments may include a corresponding interface (e.g., a flash memory interface or FLITF), a corresponding (flash) memory and a corresponding device (e.g., a microcontroller having such a memory embedded therein).

One or more embodiments may involve sharing a same flash memory between code and data thus facilitating achieving a targeted endurance for the data portion.

An idea underlying one or more embodiments is to reserve a portion of a flash memory for storing data, with such a reserved portion larger than the data memory space exposed to the user, thus facilitating achieving a suitable endurance.

In one or more embodiments, a same user address may be written in multiple physical locations so that to facilitate increasing memory endurance.

One or more embodiments make it possible to avoid that data may be lost (even in case of supply interruption) with memory erase handled on a page basis as compatible with flash operation.

One or more embodiments may reduce cost and complexity in supporting data flash memory operation, e.g., by sharing flash memory for data and code.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
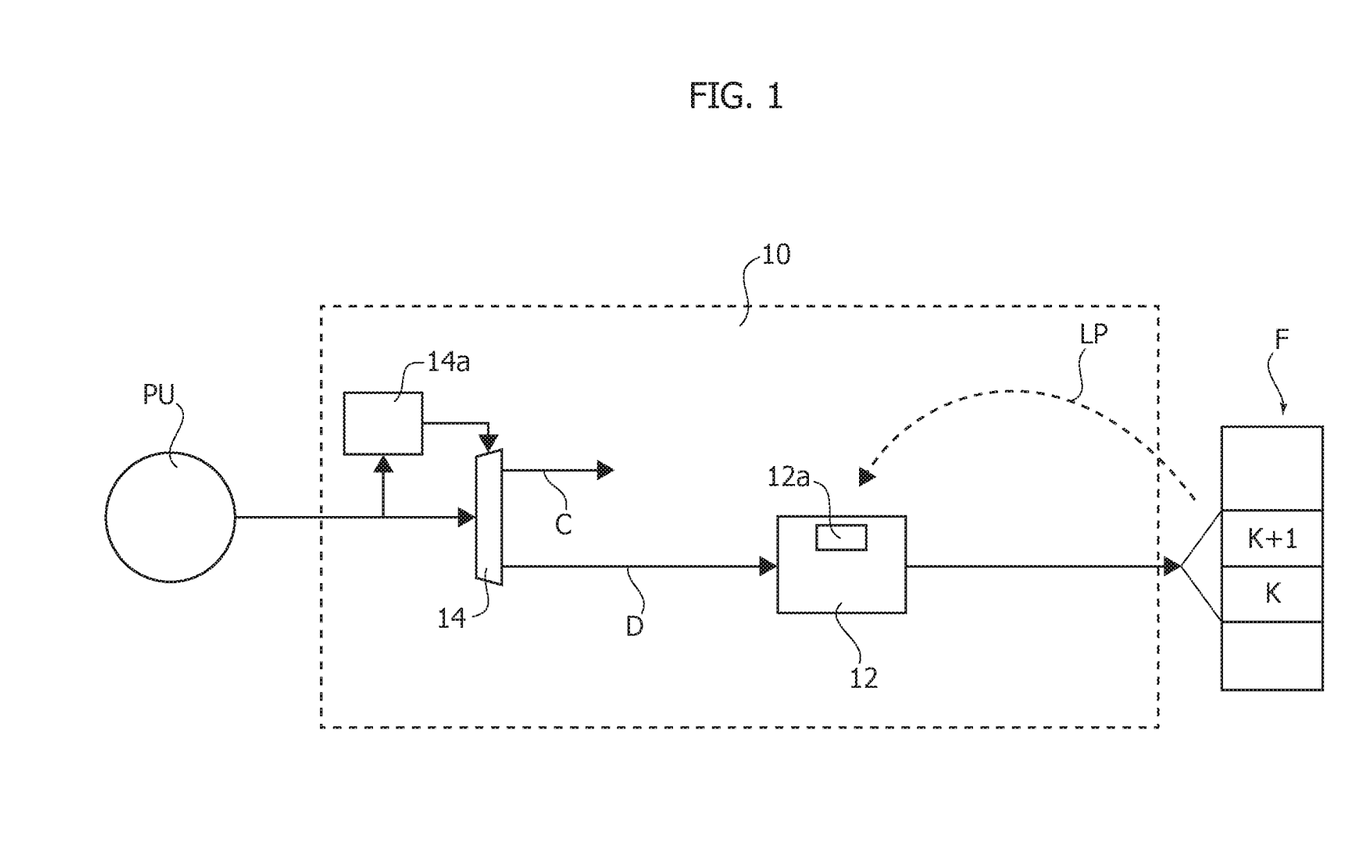
FIG. 1 is a block diagram exemplary of one or more embodiments.

In FIG. 1, reference 100 denotes a FLash memory InTerFace (FLITF) between a processing unit PU (e.g., a CPU) and a flash memory F organized in pages: two generic pages, e.g., Page K, Page K+1 are shown by way of example.

In one or more embodiments, the interface to may include a hardware controller 12, e.g., a Data Flash Engine (DFE) possibly including a Look-Up Table (LUT) 12*a* as discussed in the following.

In one or more embodiments data access requests D may be received (in addition to code access requests C) by a manager block 14 adapted to be coupled with the processing unit PU and having an associated address check block 14*a*.

An idea underlying one or more embodiments as exemplified in FIG. 1 may involve detecting if a user access is "data" access D and mapping the associated range in a bigger flash region, e.g., with access received in a 100 B range and mapped into a 4 KB range.

Of course, these values are merely exemplary and non-limiting.

In one or more embodiments, this mechanism can be implemented in the hardware controller 12 handling access to the flash memory F.

For instance, in one or more embodiments, as a result of the processing unit PU performing a memory access (which may actually occur via a bus infrastructure not shown in the figures), the address may be analyzed, e.g., by comparison in the block 14*a*.

By way of example, one may assume that the flash memory F is mapped starting from address 0x00000000 to address 0x000FFFFF (1 MB), with the last 64 B reserved for data, i.e. from address 0x000FFFC0 to address 0x000FFFFF.

In such an example:

if the PU address is below 0x000FFFC0, the access may be treated by the flash controller as normal code access (e.g., C) and no special actions are taken; and if the PU address is equal or above 0x000FFFC0, the access may be treated by the Data Flash Engine (DFE) 12 according to the approach exemplified here.

In one or more embodiments, the DFE 12 may be configured for performing other functions including handling multiple accesses to a same user address (which facilitates achieving good suitable endurance by properly handling writes) and handling data erase (which counters the risk of data losses).

By referring again (by way of non-limiting example) to the quantitative data cited above, assuming 64 B is a portion of the memory F reserved for data—as seen by the user—the actual flash memory portion reserved to handle data may be actually larger: for instance, in the example considered, the physical flash memory F may be slightly larger than 1 MB. Stated otherwise, in one or more embodiments, the actual "physical" memory size may be larger than the value indicated in the product specification (e.g., datasheet) as available to the user for application development. For instance, a 1 MB (that is 1024 KB) memory may be presented in the spec as a 1020 KB memory with the remaining 4 KB reserved for data management according to one or more embodiments.

One or more embodiments may involve the recognition that:

flash memories can be written byte-by-byte, while erase can be performed by pages, e.g., on the full memory or on a chunk of data corresponding to a page, with page size depending on the memory implementation: values such as 1 KB, 2 KB or 4 KB are exemplary of possible page sizes;

erase may take a long time and, during the erase, no write and read accesses may be performed (e.g., with software execution stalling).

In one or more embodiments, multiple writes at a same user address may be performed on different physical locations in a flash memory.

In one or more embodiments, such an approach may involve two main benefits:

no need exists of performing an erase each time a write is performed on a previously written user location;

endurance may be increased as multiple writes on a same user address are performed on different physical locations.

In one or more embodiments, each time, e.g., a data write is issued by a processing unit such as PU in FIG. 1, an empty flash location may be used to store the data along with the information that facilitates retrieving the data when requested.

Again by way of (non-limiting) example, one may assume that a flash memory F is available arranged in words of 72 bits with a desired capability of storing too bytes of (e.g., user) data.

In one or more embodiments, a similar word may be used to store 4 bytes of data, i.e. 32 bits.

Figure 2:
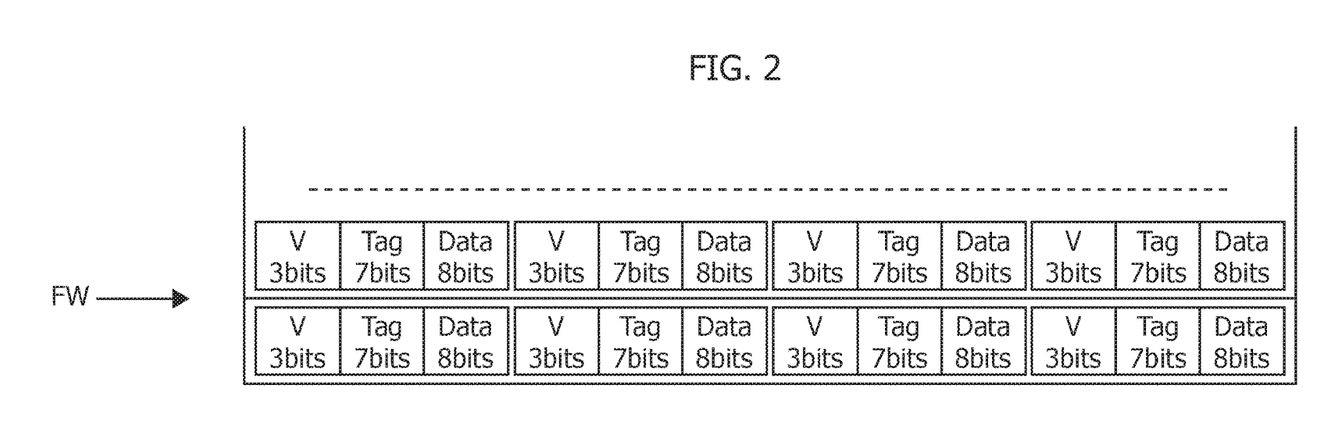
FIGS. 2, 3 and 4 are examples of memory management according to one or more embodiments.

The 72-bit word FW may be split in sub-words of 18 bits arranged as shown in FIG. 2.

The different fields may have (from right to left in FIG. 2) the following meaning:

Data (8 bits): this field contains the real data written in that location,

Tag (7 bits): the tag is the logic address associated to the data, i.e. from 0x0 to 0x63 (100 d), V (3 bit): the first bit of this field may indicate if data is valid or not, i.e. if the location is empty or not, while the remaining 2 bits may be reserved or used for instance to implement some kind of data integrity (parity, CRC, etc.).

Again, the values discussed in the foregoing are merely exemplary and non-limiting.

In one or more embodiments, the flash memory F may be written in a bottom-up direction, with data written on the first empty location each time a new data write is issued.

By adopting such a policy, the latest update data item written at a given user address K (tag=K) will be the first one matching the Tag found in searching the flash memory from the highest to the lowest flash address.

Figure 3:
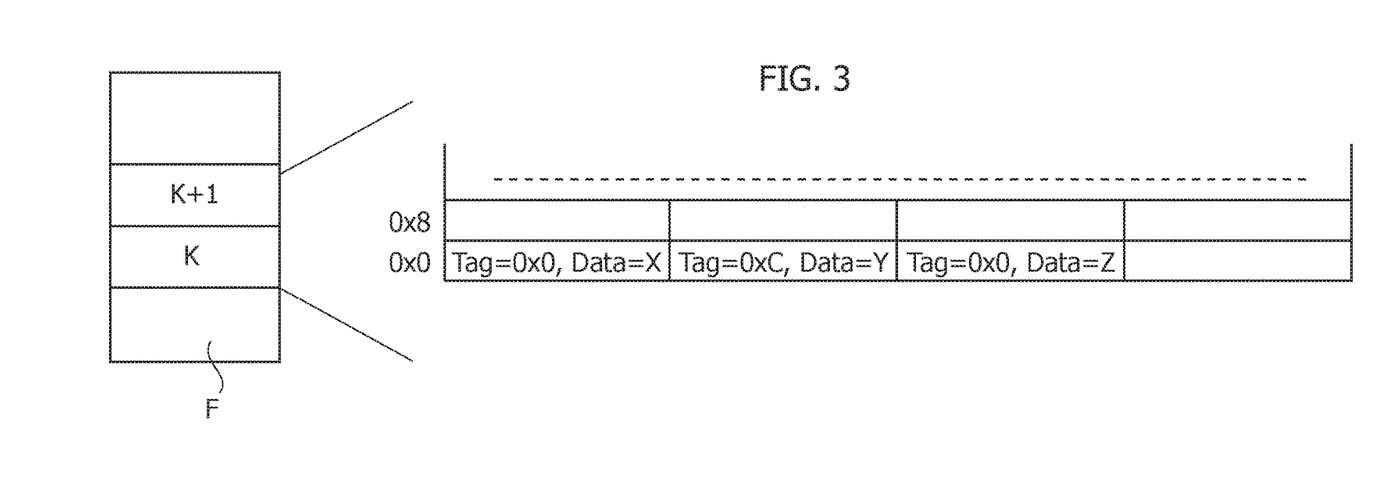

In one or more embodiments, (at least) two pages of the flash memory F (e.g., pages K and K+1) may be allocated to manage data as shown in FIG. 3 in order to efficiently handle the erase function.

A need of erasing one of the two pages may be notified to the software, for example through an interrupt or a register. When a page erase command is acknowledged (e.g., via software), the remaining data in the "full" page may be moved to the other page and the "full" page is erased.

Figure 4:
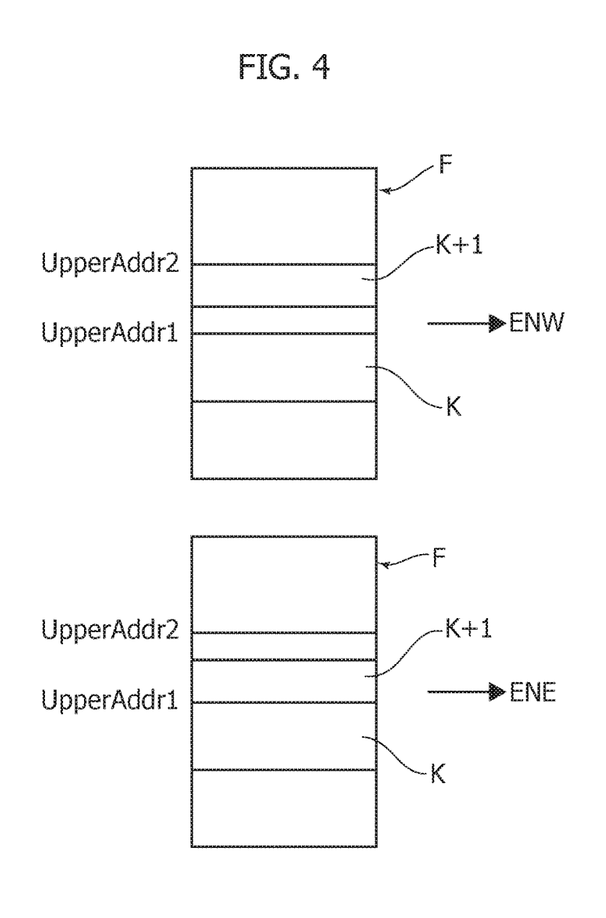

In one or more embodiments, two different levels of erase need information/message may be defined as shown in FIG. 4, e.g.:

an Erase Need Warning (ENW) may convey the information that erase can be performed as soon as possible, an Erase Need Error (ENE) may convey the information that the erase is to be performed to preserve the possibility of writing data.

Page status information handled by the DFE 12 may be updated each time a new write is performed.

The Look-Up Table (LUT) 12*a* in the DFE 12 may support such type of operation.

Figure 5:
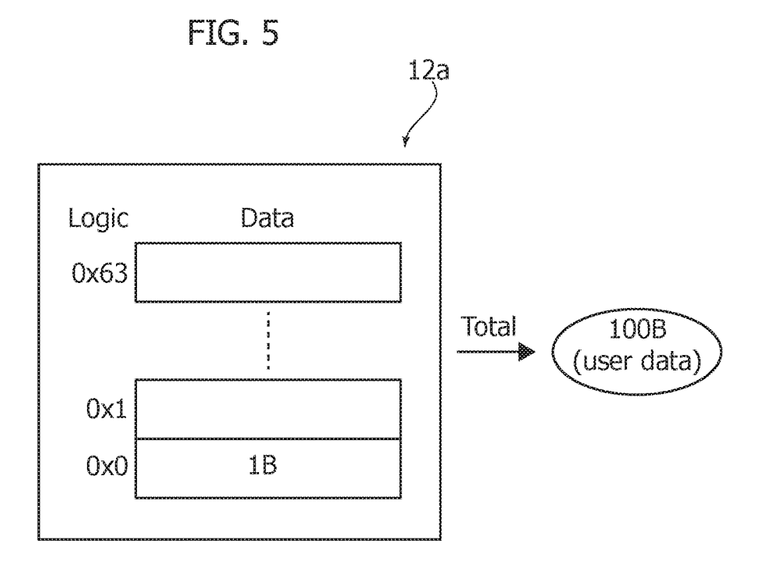
FIG. 5 is illustrative of a possible implementation of embodiments.

An example of such a LUT arrangement (e.g., too bytes of user data) is shown in FIG. 5. This arrangement can be implemented with a flip-flop buffer or as a small RAM memory.

In one or more embodiments, the LUT 12*a* may include a temporary memory used to store the most (frequently) updated data, with LUT locations identified by user addresses (e.g., without offset).

In one or more embodiments, a user address may identify the data as seen by the application (e.g., 100 B→from 0x0 to 0x63).

Each time the CPU issues a data write, this may be written in the LUT location corresponding to the user address and, at the same time, in the first empty data location in the flash memory F as explained above.

In that way, when a data item is read by the processing unit PU, no need subsists of performing a flash access, with the data retrieved directly from the LUT 12*a*. This facilitates avoiding that extra time may be required to perform the data searching in the flash memory F.

Thanks to the presence of the LUT 12*a*, data may be retrieved from the flash memory F by means of an act of populating the LUT 12*a*, which act—schematically represented as LP in FIG. 1—may be performed (only) at power-on, e.g., with the device previously switched-on and the data previously stored in the flash memory F retrieved.

In one or more embodiments, the Power-On Procedure (POP) in an arrangement as illustrated in FIG. 1 may have the main goal of populating the LUT 12*a*. Once the LUT 12*a* is (fully) populated, the same conditions existing before the switch-off are restored: data can be read directly from the LUT 12*a* and new data may be written in the first empty location in the data flash memory F.

Figure 6:
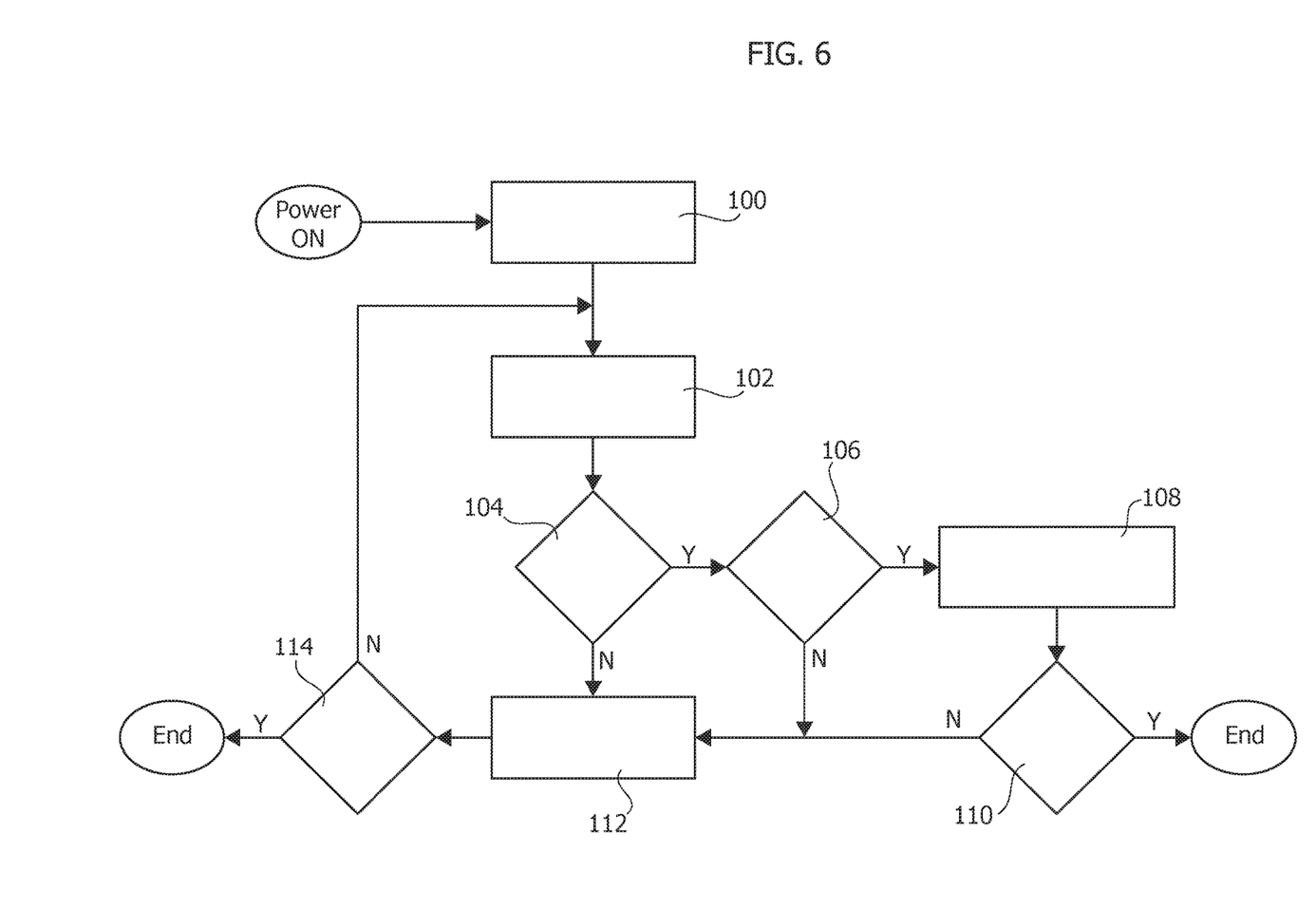
FIGS. 6, 7 and 8 are flow charts exemplary of possible operation of one or more embodiments.

A possible implementation of a Power-On Procedure (POP) is shown in the flow-chart of FIG. 6, where the blocks shown have the following meanings:

100: following power ON, address starts from the active page, e.g., from the latest page written (this information can be stored in the flash memory F);

102: read the flash memory F at the address defined in step 100;

104: check if data read at 102 (Read Data) is valid;

106: if step 104 yields a positive outcome (Y), check if LUT(Tag) is empty;

108: if step 106 yields a positive outcome (Y), set LUT(Tag)=Read Data;

110: check if LUT is fully populated; in the positive (Y) go to End;

112: if any of steps 104, 106, 110 yields a negative outcome (N), change address by setting set Addr=Addr-1 (e.g., with wrap on Full Page);

114: check if address at start is of a non-active page; if outcome negative (N) return to step 102; if outcome positive (Y) go to End.

As explained before, in one or more embodiments new data may be written in the first empty location, with information about the first empty location retrieved, e.g., during power-on.

Figure 7:
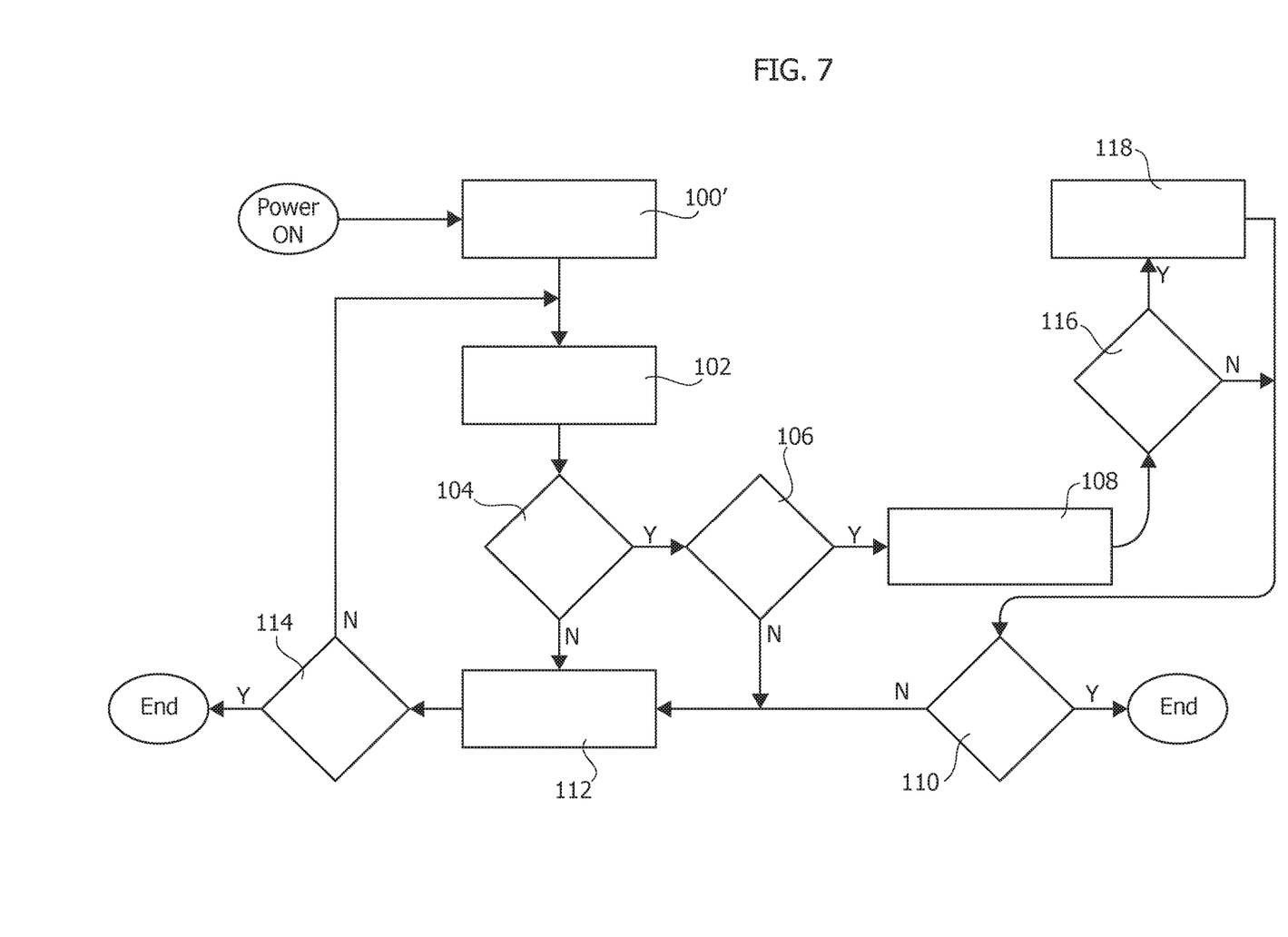

For that purpose, in one or more embodiments the procedure discussed previously can be implemented as shown in FIG. 7. In FIG. 7 blocks corresponding to blocks already discussed in connection with FIG. 6 are indicated with the same reference numerals/symbols thus making unnecessary to repeat the related description.

In one or more embodiments as exemplified in FIG. 7, step 100 is implemented as 100' by identifying the first empty location as MaxAddr, with steps 116 and 118 set between the step 108 and the step 110.

In step 116 a check is made as to whether, in addition to the page considered being an active page, the current address Addr is higher than MaxAddr.

A positive outcome (Y) of step 116 leads to a step where MaxAddr=Addr, while a negative outcome (N) of step 116 as well as the output from step 116 lead to processing being resumed from step 110.

Figure 8:
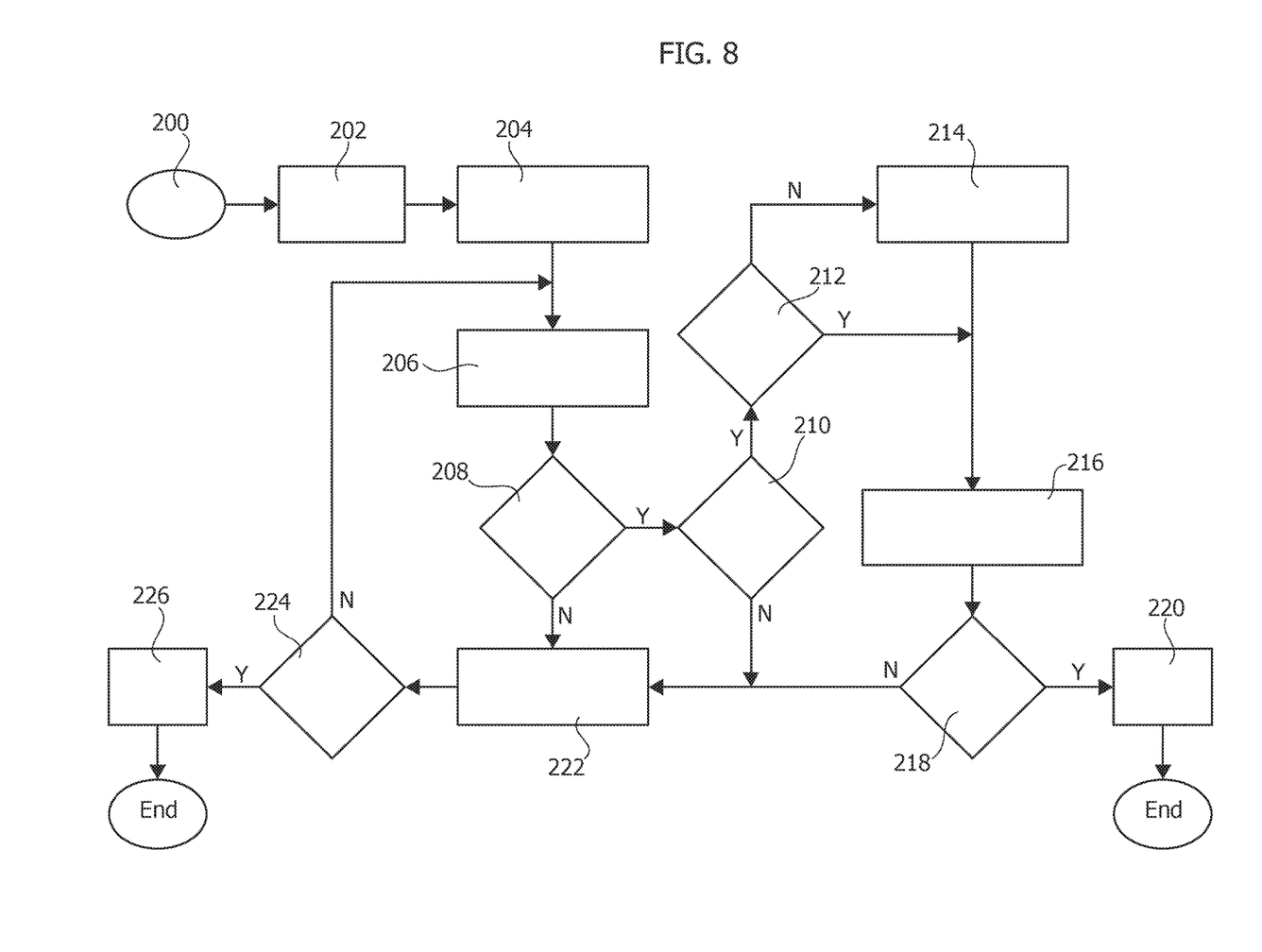

A possible implementation of a Data Erase Procedure (DEP) is shown in the flow-chart of FIG. 8, where the blocks shown have the following meanings:

200: erase requested
202: LUT clean
204: address starts from the active page;
206: read the flash memory F at the address defined in step 204;
208: check if data read at 208 (Read Data) is valid;
210: if step 208 yields a positive outcome (Y), check if LUT(Tag) is empty;
212: if step 210 yields a positive outcome (Y), check if page is active page
214: if step 212 yields a negative outcome (N), move flash entry into active page (while increasing MaxAddr):
216: if step 212 yields a positive outcome (Y) or after step 214, set LUT(Tag)=Read Data;
218: check if LUT is fully populated;
220: if step 218 yields a positive outcome (Y), erase full page and go to End;
222: if any of steps 208, 210, 218 yields a negative outcome (N), change address by setting set Addr=Addr-1 (e.g., with wrap on Full Page);
224: check if address at start is of a non-active page; if outcome negative (N) return to step 206;
226: if outcome of step 224 positive (Y), erase Full page and go to End.

In one or more embodiments a Data Erase procedure as discussed previously may be optimized to avoid the migration of data contained in the full page. Such an optimization may involve adding in the LUT 12*a* a pointer to the page containing the data. In that way, each time a page erase is performed, the data contained in the full page can be written in the active page directly from the LUT 12*a*.

This optimization may be facilitated by a same pointer being added in the flash memory F, so that during the Power-On Procedure (POP) the LUT 12*a* may be populated, e.g., with the pointer also restored).

In one or more embodiments, such a change may be implemented, e.g., by using one of the reserved bits shown in FIG. 2.

In one or more embodiments, the erase time may be "hidden" from the user by resorting to an interleaving arrangement, wherein:

user writes (with user write time possibly limited, e.g., to an EEPROM write time, e.g., 5 ms) still accepted during the Data Erase Procedure (DEP) and performed only in the LUT, with the DEP procedure (fully) triggered by hardware, write-back of updated LUT data is performed after DEP ends.

In one or more embodiments a method of providing non-volatile data memory (NVM) space for a range of user addresses may include:

providing a range of non-volatile flash memory locations (e.g., K, K+1; FW) for writing data, wherein the range of flash memory locations for writing data is larger (that is, with the physical locations for writing data more numerous than the user addresses, e.g., 4 KB v. 100 B) than the range of user addresses (e.g., 4 KB v. 100 B), writing (e.g., 12) data for a same user address in a plurality of different flash memory locations in the range of flash memory locations.

One or more embodiments may include:

receiving flash memory user access requests, checking (e.g., at 14*a*) if a certain request in the flash memory user access requests (e.g., D) is a data access request, if the certain request is a data access request, mapping the range of user addresses into the larger range of flash memory locations.

One or more embodiments may include configuring the flash memory locations for writing data (e.g., FW) to include:

a first field (e.g., Data) to contain data written in the location, a second field (e.g., Tag) to contain a tag indicative of a logic address coupled to the data written in the location.

One or more embodiments may include configuring the flash memory locations for writing data to include a third field (e.g., V) to contain a flag indicative of whether the location is empty or not.

One or more embodiments may include writing data in the range of flash memory locations in a bottom-up direction, with data written on the first empty location each time a new data write is issued.

One or more embodiments may include providing a temporary memory configured as a look-up table (e.g., 12*a*) with the user addresses in the range of user addresses as entries to the locations in the look-up table.

One or more embodiments may include receiving a data write command of writing data to the range of flash memory locations, the write command addressed to a certain user write address in the range of user addresses, and writing the data coupled with the data write command in the location of the look-up table having the certain user write address as an entry, and in an empty data location in the range of flash memory locations.

One or more embodiments may include receiving a data read command of reading data from the range of flash memory locations, the read command addressed to a certain user read address in the range of user addresses, and reading the data coupled with the data read command from the location of the look-up table having the certain user read address as an entry, without accessing the range of flash memory locations.

One or more embodiments may include, upon powering-on the temporary memory and the range of flash memory locations after a power-off, retrieving the data written in the range of flash memory locations, and populating (e.g., LP in FIG. 1) the temporary memory with the data retrieved in the range of flash memory locations.

One or more embodiments may include arranging the physical locations of the range of flash memory locations in pages, and erasing the flash memory locations on a page basis.

One or more embodiments may include receiving a page erase command for a certain page in the range of flash memory locations, moving data in the certain page to another page in the range of flash memory locations, and erasing the certain page in the range of flash memory locations.

One or more embodiments may include receiving a page erase command for a certain page in the range of flash memory locations, and erasing the certain page in the range of flash memory locations by writing to the another page data from the temporary memory.

One or more embodiments may include receiving a page erase command for a certain page in the range of flash memory locations, triggering a data erase procedure in the range of flash memory locations, providing a temporary memory and performing in the temporary memory any user write requests received during the data erase procedure, and once the data erase procedure is ended, writing from the temporary memory to the range of flash memory locations data from user write requests received during the data erase procedure.

One or more embodiments may include a flash memory interface (e.g., 10) to provide non-volatile data memory space including a range of user addresses by means of a range of flash memory locations for writing data. The interface includes an address check module and a hardware controller coupled with the address check module. The address check module (e.g., 14, 14*a*) can be used for receiving flash memory user access requests and checking if a certain request in the flash memory user access requests is a data access request. The hardware controller is configured for mapping the range of user addresses into a range of flash memory locations for writing data which is larger than the range of user addresses, and writing data for a same user address in a plurality of different flash memory locations in the range of flash memory locations with the method of one or more embodiments.

In one or more embodiments, a flash memory may include a range of flash memory locations, and an interface according to one or more embodiments, wherein the hardware controller in the interface is coupled with the flash memory to map the range of user addresses into the range of flash memory locations for writing data in the flash memory.

In one or more embodiments an electronic device, such as a microcontroller, may include, optionally embedded therein, a flash memory according to one or more embodiments.

Without prejudice to the underlying principles, the details and embodiments may vary, even significantly, with respect to what has been disclosed by way of example only, without departing from the extent of protection.

The extent of protection is defined by the annexed claims.

What is claimed is:

1. A method of providing non-volatile data memory space for a range of user addresses, the method comprising:
    providing a range of non-volatile flash memory locations for writing data, wherein the range of non-volatile flash memory locations for writing data is larger than the range of user addresses;
    writing data for the same user address in a plurality of different non-volatile flash memory locations in the range of non-volatile flash memory locations;
    receiving flash memory user access requests;
    checking if a certain request in the flash memory user access requests is a data access request; and
    in response to the certain request being a data access request, mapping the range of user addresses into the range of non-volatile flash memory locations.

2. The method of claim 1, further comprising writing data in the range of non-volatile flash memory locations in a bottom-up direction, with data written in a first empty location each time a new data write is issued.

3. The method of claim 1, further comprising providing a temporary memory configured as a look-up table with the user addresses in the range of user addresses as entries to the look-up table.

4. The method of claim 3, further comprising:
    receiving a data write command of writing data to the range of non-volatile flash memory locations, the data write command addressed to a certain user write address in the range of user addresses; and
    writing the data coupled with the data write command in a location of the look-up table having the certain user write address as an entry, and in an empty data location in the range of non-volatile flash memory locations.

5. The method of claim 4, further comprising:
receiving a data read command of reading data from the range of non-volatile flash memory locations, the data read command addressed to a certain user read address in the range of user addresses; and
reading the data coupled with the data read command from a location of the look-up table having the certain user read address as an entry, without accessing the range of non-volatile flash memory locations.

6. The method of claim 4, further comprising, upon powering-on the temporary memory and the range of non-volatile flash memory locations after a power-off:
retrieving the data written in the range of non-volatile flash memory locations; and
populating the temporary memory with the data retrieved in the range of non-volatile flash memory locations.

7. The method of claim 4, wherein physical locations of the range of non-volatile flash memory locations are arranged in pages, the method further comprising:
erasing the non-volatile flash memory locations on a page basis;
receiving a page erase command for a certain page in the range of non-volatile flash memory locations; and
erasing the certain page in the range of non-volatile flash memory locations by writing to another page data from the temporary memory.

8. The method of claim 1, wherein physical locations of the range of non-volatile flash memory locations are arranged in pages, the method further comprising erasing the non-volatile flash memory locations on a page basis.

9. The method of claim 8, further comprising:
providing a temporary memory configured as a look-up table with the user addresses in the range of user addresses as entries to the look-up table;
receiving a page erase command for a certain page in the range of non-volatile flash memory locations; and
erasing the certain page in the range of non-volatile flash memory locations by writing to another page data from the temporary memory.

10. The method of claim 8, further comprising:
receiving a page erase command for a certain page in the range of non-volatile flash memory locations;
triggering a data erase procedure in the range of non-volatile flash memory locations,
providing a temporary memory;
performing in the temporary memory any user write requests received during the data erase procedure; and
once the data erase procedure is ended, writing data from the temporary memory to the range of non-volatile flash memory locations, the data from user write requests received during the data erase procedure.

11. The method of claim 1, wherein the range of non-volatile flash memory locations includes 4 KB and the range of user addresses includes 100 B.

12. A method of providing non-volatile data memory space for a range of user addresses, the method comprising:
providing a range of non-volatile flash memory locations for writing data, wherein the range of non-volatile flash memory locations for writing data is larger than the range of user addresses;
writing data for the same user address in a plurality of different non-volatile flash memory locations in the range of non-volatile flash memory locations; and
configuring the non-volatile flash memory locations for writing data to include a first field to contain data, and a second field to contain a tag indicative of a logic address coupled to the data written in the first field.

13. The method of claim 12, wherein configuring the non-volatile flash memory locations for writing data further comprises configuring the non-volatile flash memory locations for writing data to include a third field to contain a flag indicative of whether the first field is empty or not.

14. A method of providing non-volatile data memory space for a range of user addresses, the method comprising:
providing a range of non-volatile flash memory locations for writing data, wherein the range of non-volatile flash memory locations for writing data is larger than the range of user addresses, and wherein physical locations of the range of non-volatile flash memory locations are arranged in pages;
writing data for the same user address in a plurality of different non-volatile flash memory locations in the range of non-volatile flash memory locations;
erasing the non-volatile flash memory locations on a page basis;
receiving a page erase command for a certain page in the range of non-volatile flash memory locations;
moving data in the certain page to another page in the range of non-volatile flash memory locations; and
erasing the certain page in the range of non-volatile flash memory locations.

15. A flash memory interface to provide non-volatile data memory space including a range of user addresses corresponding to a range of flash memory locations for writing data, the interface comprising:
an address check module configured to receive flash memory user access requests and to check whether a certain request in the flash memory user access requests is a data access request; and
a hardware controller coupled with the address check module, the hardware controller configured to map the range of user addresses into a range of flash memory locations for writing data which is larger than the range of user addresses, and to cause data for the same user address to be written in a plurality of different flash memory locations in the range of flash memory locations.

16. The flash memory interface of claim 15, wherein the hardware controller is further configured to receive flash memory user access requests, to check whether a certain request in the flash memory user access requests is a data access request, and, in response to the certain request being a data access request, to map the range of user addresses into the range of flash memory locations.

17. The flash memory interface of claim 15, further comprising a temporary memory configured as a look-up table with the user addresses in the range of user addresses as entries to the look-up table.

18. The flash memory interface of claim 15, wherein physical locations of the range of flash memory locations are arranged in pages and wherein the hardware controller is further configured to cause the flash memory locations to be erased on a page basis.

19. The flash memory interface of claim 15, wherein the flash memory locations for writing data comprise a first field configured to contain data, and a second field configured to contain a tag indicative of a logic address coupled to the data written in the first field.

20. A device comprising:
flash memory including a range of flash memory locations;

an address check module configured to receive flash memory user access requests and to check whether a certain request in the flash memory user access requests is a data access request; and a hardware controller coupled with the address check module, the hardware controller configured to map a range of user addresses into the range of flash memory locations for writing data which is larger than the range of user addresses, and to cause data for the same user address to be written in a plurality of different flash memory locations in the range of flash memory locations.

21. The device of claim 20, wherein the flash memory is embedded in an electronic device.

22. The device of claim 20, further comprising a temporary memory configured as a look-up table with the user addresses in the range of user addresses as entries to the look-up table.

* * * * *